United States Patent [19]
Hannigan et al.

[11] Patent Number: 5,770,898
[45] Date of Patent: Jun. 23, 1998

[54] MODULAR POWER MANAGEMENT SYSTEM WITH COMMON EMC BARRIER

[75] Inventors: Matthew T. Hannigan; Ronald R. Carleton; Paul Bonomo, all of San Jose, Calif.; John W. Kerr, Jr., Palm Coast, Fla.; James M. Worsham, Campbell, Calif.; Robin Spires, Munich, Germany; Franz Gisin, Los Altos; William Beyda, Cupertino, both of Calif.

[73] Assignee: Siemens Business Communication Systems, Inc., Santa Clara, Calif.

[21] Appl. No.: 624,325

[22] Filed: Mar. 29, 1996

[51] Int. Cl.⁶ .................................................. H05K 9/00
[52] U.S. Cl. ........................ 307/147; 307/91; 174/35 R; 174/35 GC; 361/816
[58] Field of Search .................. 174/35 GC, 35 MS, 174/35 C, 35 R; 361/816, 818; 307/147, 150, 91, 89, 149; 277/227–235; 320/57; 363/146

[56] References Cited

U.S. PATENT DOCUMENTS

| | | | |
|---|---|---|---|
| 4,900,877 | 2/1990 | Dubrow et al. | 174/35 GC |
| 5,164,543 | 11/1992 | Benson et al. | 174/35 R |
| 5,235,638 | 8/1993 | Dondero | 379/399 |
| 5,545,845 | 8/1996 | Flores | 174/35 R |
| 5,633,786 | 5/1997 | Matuxzewski et al. | 361/818 |

*Primary Examiner*—William M. Shoop, Jr.
*Assistant Examiner*—Jonathon Kaplin

[57] ABSTRACT

A power management system for providing power to a main system, such as a telecommunications device, includes a number of modules that are joined by module-to-module interfaces that achieve a common EMC containment barrier. In one embodiment, a battery module defines a first EMC compartment that houses one or more backup batteries, a battery management module defines a second EMC compartment that includes circuitry such as recharging circuitry, and a power entry module includes a third EMC compartment. The power entry module has an input/output connection to the battery management module and has an AC input. An output cable extends from the power entry module to the main system. Compliant metallic module-to-module gaskets preserve EMC integrity at cable pass-throughs from the battery management module to the battery and power entry modules. The modules are mounted to a system housing in a manner that secures the modules in a desired relationship.

19 Claims, 6 Drawing Sheets

5,770,898

MODULAR POWER MANAGEMENT SYSTEM WITH COMMON EMC BARRIER

TECHNICAL FIELD

The invention relates generally to power management systems, such as those used in telecommunications systems, and more particularly to housing a power management system in order to achieve electromagnetic compatibility (EMC) containment.

BACKGROUND ART

Power management systems may be used to regulate and supply various voltages for operating a related system. For example, a power management system may include filters and rectifying circuitry for converting an AC line voltage, e.g., 120V, to the required voltage configuration for operating a telecommunications system. The power management system may also include a backup battery and battery management circuit, with the battery being used at times when the line voltage is unavailable. The battery management circuitry will typically include a recharging circuit for maintaining the charge of the battery during periods of non-use. Another common component of a power management system is a surge protection circuit.

In some applications, the power management must be housed in a manner to achieve electromagnetic compatibility (EMC) compliance with regard to either the power management system itself or the device that is to be powered. EMC is the ability of a system or device to function as intended within its electromagnetic environment. EMC containment barriers are sometimes used to prevent the emission of electromagnetic disturbance from reaching a level that would interfere with the normal operation of another system or device.

Reduced to its basics, there are three components of an EMC difficulty. There is a generator of electromagnetic disturbance, a receiver of the disturbance and a path that permits the generated electromagnetic disturbance to interfere with normal operation of the receiver. An EMC difficulty may be corrected by identifying one of the components and taking measures to attenuate or eliminate the coupling of electromagnetic energy from the transmitter to the receiver. For example, an EMC containment barrier may be formed about a power management system in order to obstruct the path of electromagnetic interference from the power management system to another device or system.

In the telecommunications industry, an EMC containment scheme has conventionally involved a fully shielded main cabinet to house both the power management system and the telecommunications components. A disadvantage of this "full system" EMC containment approach is that shielding increases the cost of manufacturing the system. Moreover, a fully shielded design may not be necessary in every installation, since a backup battery may not be required for some applications.

What is needed is a power management system that includes electromagnetic compatibility containment in a cost-effective manner. What is also needed is such a system that is adaptable to meet the varying needs of different applications.

SUMMARY OF THE INVENTION

A power management system is divided into a number of subassemblies, with each subassembly having an EMC compartment. In the preferred embodiment, the EMC compartments are portions of a single EMC containment barrier. Each subassembly is an independent module having walls that block passage of electromagnetic energy.

BEST MODE FOR CARRYING OUT THE INVENTION

Figure 1:
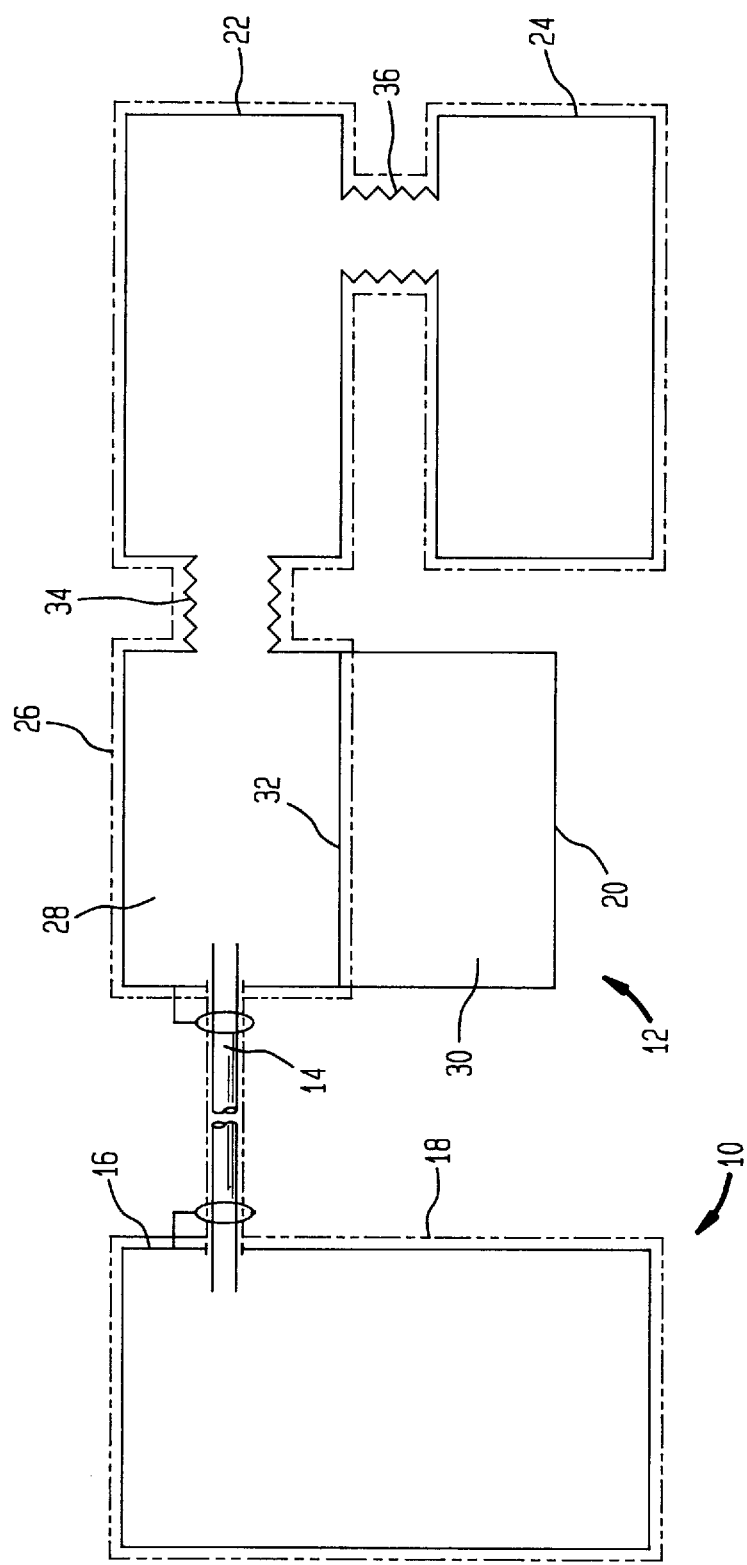
FIG. 1 is a block diagram of a power management system connected to provide power to a main system, with the power management system being a modular assembly that forms a common EMC barrier.

In a preferred embodiment, the power management system provides power to a telecommunications system. The first module is a power entry module having circuitry for supplying the required voltages for operation of the telecommunications components. An AC line cable extends from the power entry module for connection to an AC supply. This module may be divided by an internal barrier that isolates "load" terminals from "line" terminals of an AC line filter. For applications in which the internal barrier is used, EMC containment begins on the side of the barrier opposite to the connection of the AC line cable. That is, the internal barrier delineates the EMC "clean" first compartment from an EMC "dirty" area of the power entry module. However, the delineation is not critical.

An output cable extends from the power entry module to the system or device that is to be powered. Within telecommunications applications, it is typical to include a braided shield along the output cable, with the braided shield being grounded both at the power management system and at the telecommunications system. Preferably, there is a removable cover that provides access to the connection of the output cable and the first EMC compartment of the power entry module. This facilitates the removal of the power entry module.

The second subassembly is a battery management module that includes circuitry for recharging a backup battery. The battery management module includes a metallic frame that forms a second EMC compartment. The third subassembly is a battery module having a metallic frame that forms the third EMC compartment. As an example, a backup battery that provides −48 volts may be housed within the third EMC compartment.

As previously noted, the preferred embodiment links the three EMC compartments into a single containment barrier. This requires module-to-module interfaces that preserve the integrity of EMC containment. As a first component of such interfaces, the three modules are fixed in position relative to each other by being mounted to a system housing. At one side of each module is a finger-and-slot arrangement to provide a fastenerless holddown. In this arrangement, the modules may each have protrusions that slide within slots of the system housing to properly position the individual modules. At the opposite end of each module, bolts secure the module to the system housing. A second component of the EMC-integrity interfaces is the use of metal gaskets that connect cable openings of adjacent modules. A first metal gasket extends between the battery module and the battery management module. The first metal gasket connects the openings that are provided within the modules in order to provide passage of a battery cable. A second metal gasket extends between the cable openings for passage of the cable from the battery management module to the power entry module. The gaskets should be formed of a material having a compressive strength that accommodates some variation in the positioning of the modules. An acceptable metal is spring steel.

An advantage of the invention is that the modularity allows part replacements to be less costly and typically less complex than prior approaches. The modules are mounted independently, but still combine to form a single EMC containment barrier.

In some applications, the battery may not be required. Since the EMC containment system of the invention is modular, the battery and battery management subassemblies may easily be deleted, permitting a reduction in the cost of EMC containment. As previously noted, the power entry module may include a first removable cover that provides easy access to the connection of the output cable. A second removable cover may be used to overlay the opening that is provided for the cable to the power management module, so that the integrity of EMC containment is preserved if the battery management and battery modules are deleted.

With reference to FIG. 1, a main system 10 is shown as receiving power from a modular power management system 12 via an output cable 14. In the preferred embodiment, the main system is a telecommunications system. For example, the main system may include a switching exchange and a number of line shelves for operating a private branch exchange (PBX). The output cable 14 includes a braided shield that is grounded to a metallic frame 16 of the main system. The grounding of the shielded output cable is conventional in the telecommunications industry. The metallic frame forms an EMC barrier, which is represented by the broken lines 18.

The power management system 12 includes three modules—a power entry module 20, a battery management module 22, and a battery module 24. The power entry module 20 may include filtering and surge protection circuitry. The battery management module 22 may include circuitry for recharging a battery and for managing output voltages of one or more batteries. The battery module 24 may house one or more backup batteries, such as a −48V battery array, that can be used to supply the necessary voltages for operating the main system 10. The components housed within the individual modules 20–24 will be set forth in greater detail below.

Although the three modules 20–24 are individually mounted and replaceable, in the preferred embodiment of the power management system 12, the module interconnections achieve a common EMC barrier for the three modules. The common EMC barrier is represented by the broken lines 26. While not critical, the power entry module 20 includes an EMC "clean" compartment 28 and a less clean compartment 30. The two compartments are separated by an interior barrier 32 that delineates the EMC containment. As will be explained more fully below, the interior barrier may isolate "load" terminals of an AC line filter from "line" terminals of the same filter and from other components of the power entry module. The braided output cable 14 extends from the EMC clean compartment 28 and is electrically grounded to a metallic frame of the module.

In the preferred embodiment, EMC containment integrity is preserved at module-to-module interfaces by use of metallic gaskets 34 and 36. Stainless steel may be used to provide a consistent gasketing interface, while providing sufficient compliance to accommodate manufacturing tolerances. Preferably, the modules are secured at one end by fastenerless holddowns and at the opposite end by at least one bolt. The fastenerless holddowns may be achieved by means of slot-and-finger arrangements. In this arrangement, the modules each have protrusions that slide into the slots formed at a system housing to properly position the individual modules relative to each other. At the opposite ends of the modules, bolts secure the modules to the system housing. The metallic gaskets 34 and 36 provide one component of the EMC-integrity interfaces, while the mounting achieves a module registration that is a second component of the EMC-integrity interfaces.

Figure 2:
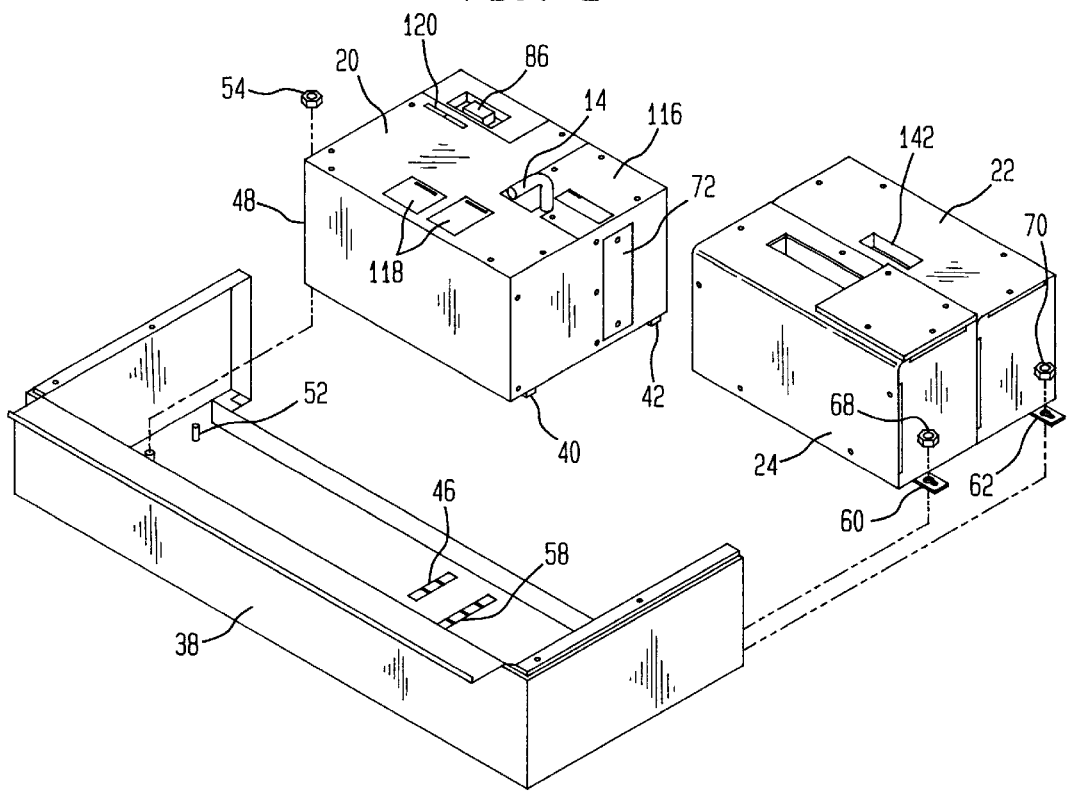
FIG. 2 is an exploded perspective view of an embodiment of the modular power management system of FIG. 1.
Figure 3:
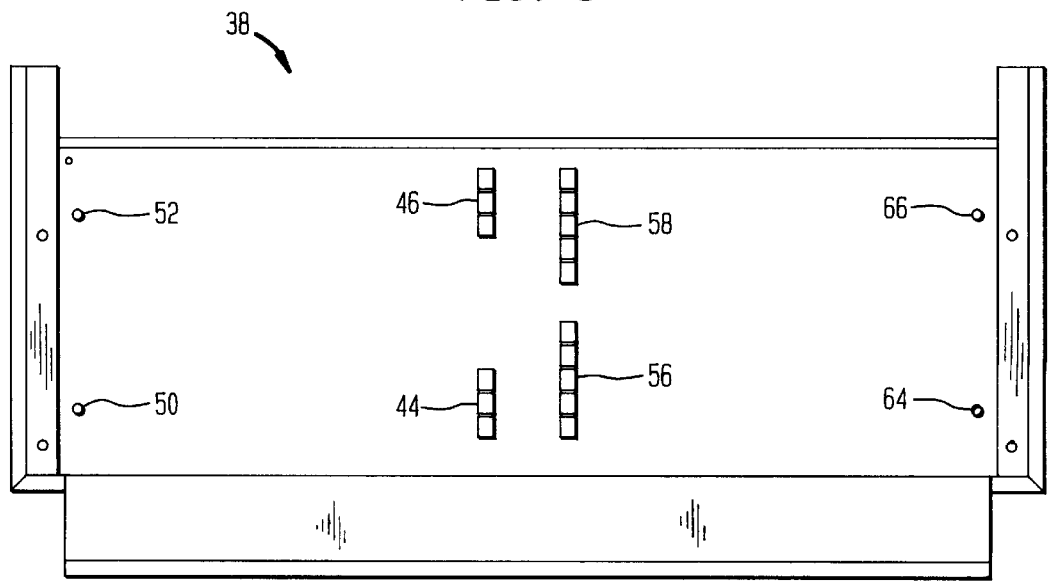
FIG. 3 is a top view of a system housing of FIG. 2.

The mounting arrangement may be seen more clearly with reference to FIGS. 2 and 3. Each of the three modules 20–24 is mounted to a system housing 38. The power entry module 20 includes a pair of fingers 40 and 42 that curl under the module and that are dimensioned to be received within slots formed by raised areas of a pair of brackets 44 and 46 connected to the system housing. At the opposite end of the power entry module 20, two brackets 48 (only one of which is shown in FIG. 2) have openings that receive externally-threaded studs 50 and 52 when the module is properly aligned with respect to the system housing. Nuts 54 are then threaded onto the studs to secure the module in position.

The battery management module 22 and the battery module 24 include fingers, not shown, that are received within slots formed by raised regions of brackets 56 and 58 on the system housing. Each of the modules 22 and 24 has two fingers that slide into the two slots of the associated bracket 56 and 58. At the opposite end of each module is a single bracket 60 and 62 having an opening for mounting the bracket to an externally-threaded stud 64 and 66. Nuts 68 and 70 are threaded onto the studs to secure the modules in position.

An advantage of the modular power management system having common EMC containment in the manner shown in FIGS. 1–3 is that it is potentially more cost effective. For some prior art EMC containment schemes, the main system and the power system are housed in a single fully shielded cabinet. This leads to cost inefficiency if the particular telecommunications application does not require a fully shielded front-end power conditioning system and/or fully shielded backup batteries, since the cost of designing and manufacturing the EMC containment is significant. The modularity of the power management system 12 of FIGS. 1–3 allows the EMC containment to be limited to enclosing only those components that potentially affect performance of one or both of the systems 10 and 12.

Some systems may not require a backup battery, so that the battery management module 22 and the battery module 24 may be deleted. By housing the power system separately from the main system 10 and by providing the modularity, components can be easily omitted without leaving large vacant spaces within costly EMC containment structures. Referring to FIG. 2, a removable cover 72 may be used at the pass-through for cabling to the battery management module 22, if the modules 22 and 24 are not to be used. The cover 72 is a sheetmetal plate that blocks passage of electromagnetic interference (EMI).

Figure 4:
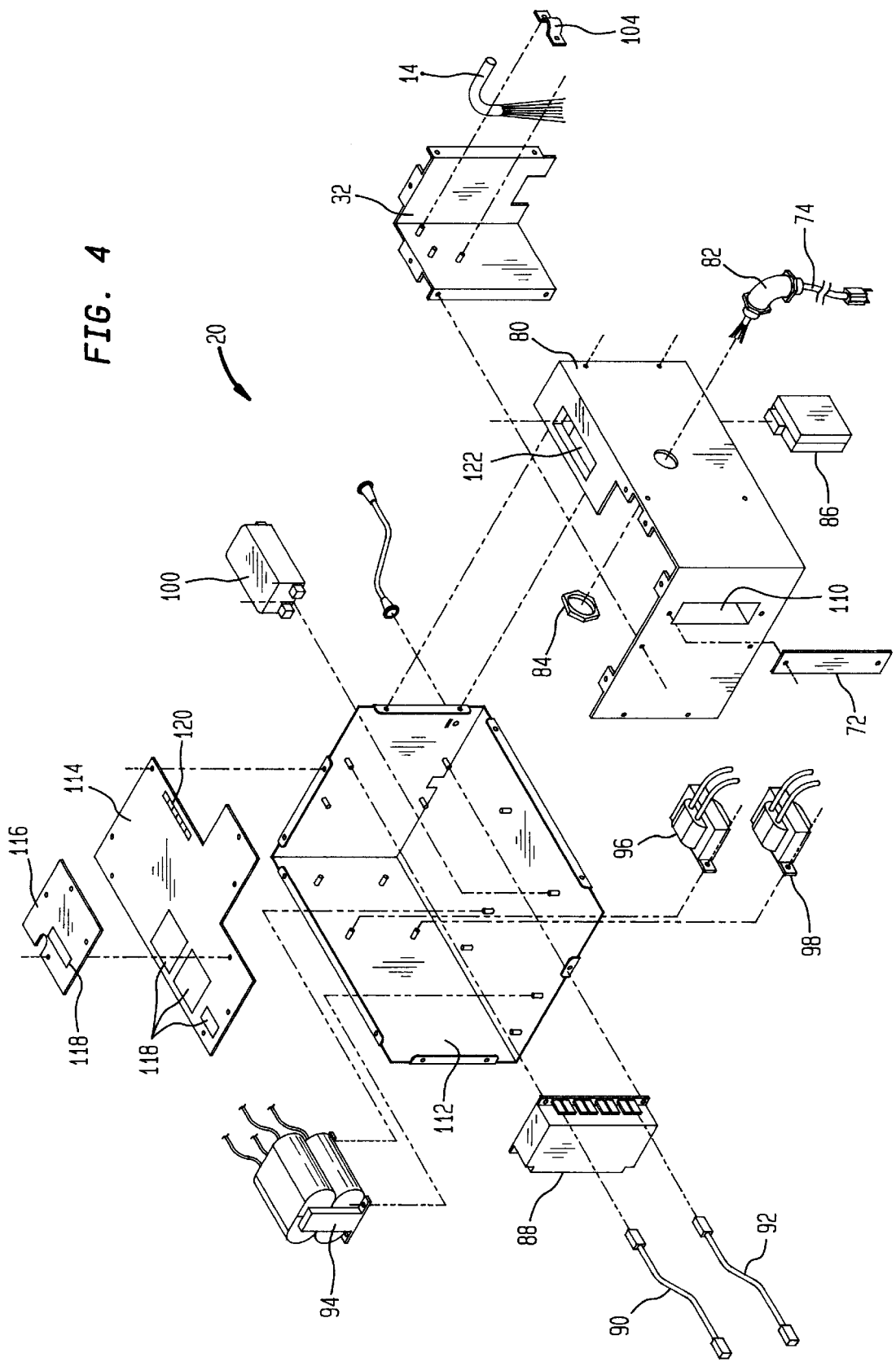
FIG. 4 is an exploded perspective view of the power entry module of FIG. 2.
Figure 5:
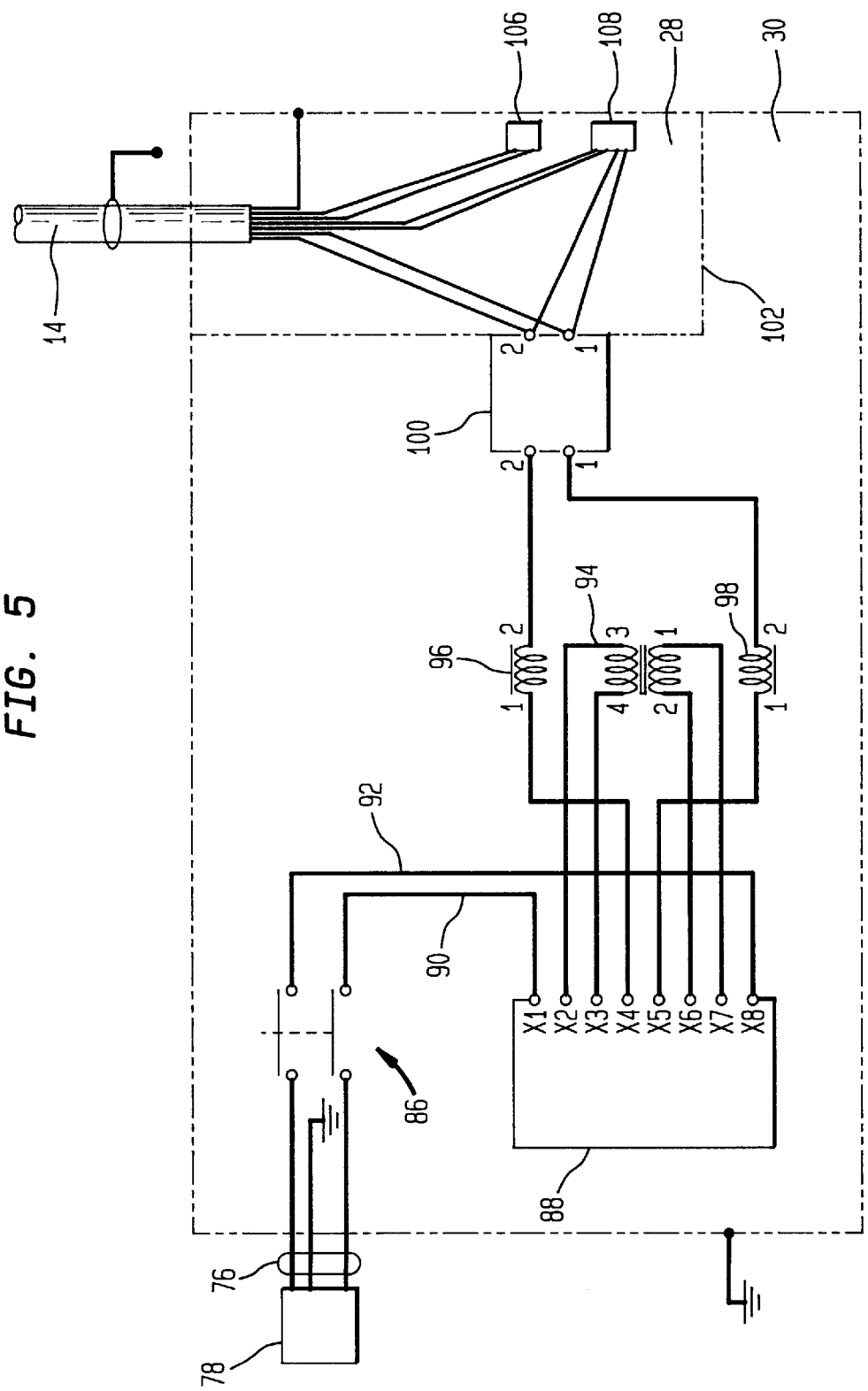
FIG. 5 is a schematical view of the electrical components of FIG. 4.

FIG. 4 is an exploded view of the power entry module 20, while FIG. 5 is a schematical view of the electrical components of the module. An AC cable 74 having at least three wires 76 is plugged into a source 78 of AC power. The cable 74 is mounted to a formed sheetmetal plate that defines some of the walls of the module. The cable passes through a strain relief member 82, which is held in place by a nut 84.

Two of the wires 76 of the AC cable 74 are connected to line terminals of a circuit breaker 86. The load terminals of the circuit breaker are connected to a circuit card 88 via wires 90 and 92. The circuit card includes power conditioning circuitry, such as a surge protection circuit. The card is connected to a common mode choke 94 and a pair of linear inductors 96 and 98. The leads of the linear inductors opposite to the circuit card 88 are connected to line terminals of an EMI filter 100. All of the circuitry of FIG. 5 is known in the art.

As previously noted, the power entry module 20 includes an EMC clean compartment 28 and a less clean compartment 30. The delineation between the two compartments is represented by the rectangle 102 in FIG. 5. The interior barrier 32 of FIG. 4 provides the separation between the two compartments of the module. A bracket 104 is mounted to the interior barrier to secure the output cable 14 in position. Wires of the output cable connect to the load terminals of the EMI filter 100, so as to conduct the power to the main system, e.g., the telecommunications system. Other wires of the output cable terminate at connectors 106 and 108. The connectors are used to connect the power entry module to the battery management module. If power is required from the backup battery, the power is received via the connectors. Connector 108 is linked to the load terminals of the EMI filter 100, thereby providing power for recharging the backup battery.

The connectors 106 and 108 of FIG. 5 are not shown in FIG. 4. Rather, the removable cover 72 is shown. As previously noted, the removable cover is employed in applications in which the other two modules are not required. The removable cover 72 then conceals a cable pass-through 110.

Most of the elements of FIG. 4 are secured to a housing base 112. The base is formed of a material that provides EMC containment. An acceptable material is sheetmetal. A removable plate 114 and a second removable cover 116 are fastened to the upper area of the housing base 112. The second removable cover facilitates access to the various plugs and connectors 106 and 108 of the output cable 14. Optionally, the removable plate 114 and the second removable cover 116 include a number of labels 118, such as an on/off label 120 located to be adjacent to an opening 122 of formed plate 80 through which the circuit breaker 86 is visible.

Figure 6:
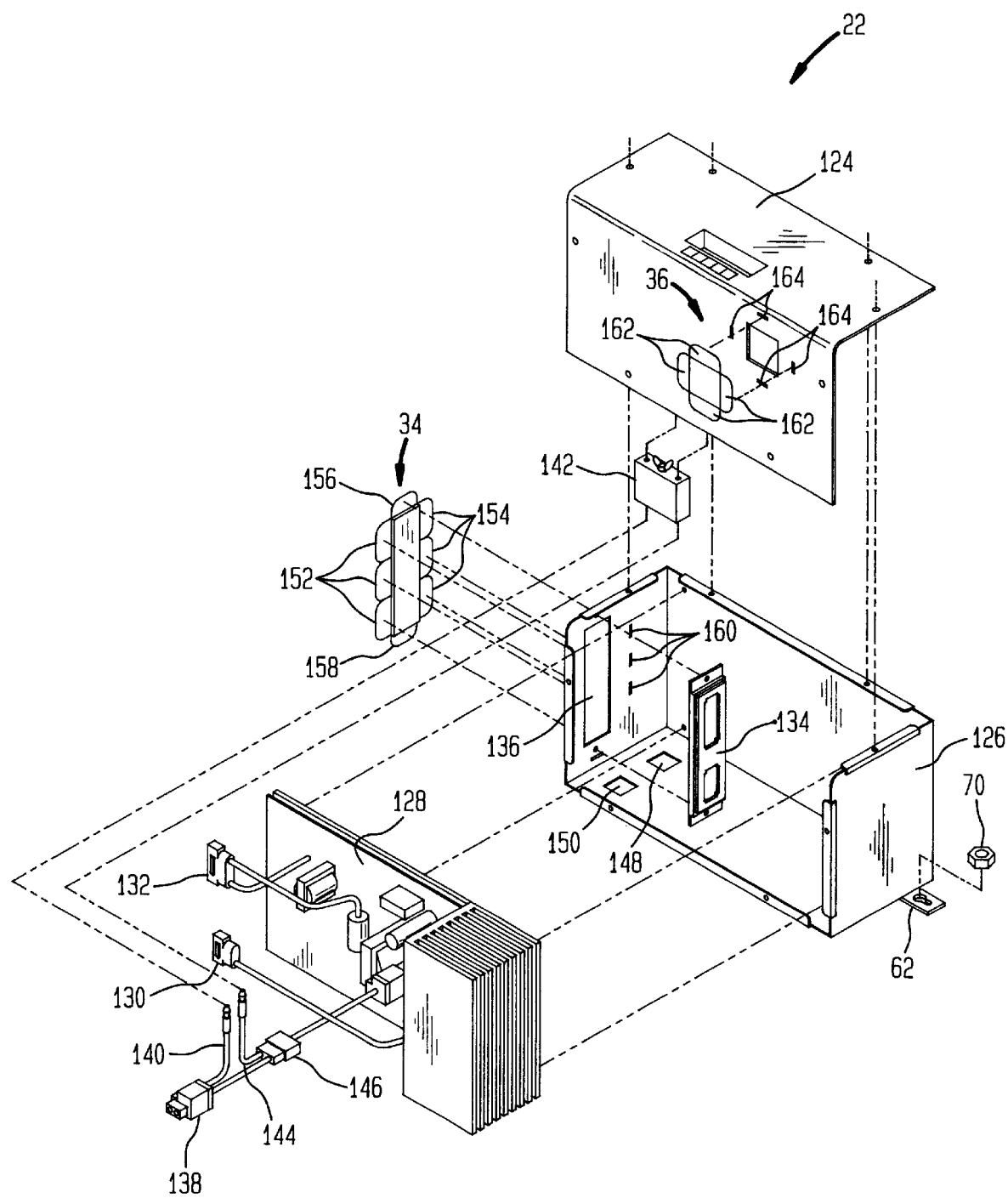
FIG. 6 is an exploded perspective view of the battery management module of FIG. 2.

An exploded view of the battery management module 22 is shown in FIG. 6. An EMC containment compartment is formed by attaching a metallic cover 124 to a metallic base 126. Housed within the compartment is a circuit board 128 having battery management circuitry, including recharge capability. A pair of plugs 130 and 132 conduct voltages to and from the circuit board 128. The plugs are mounted to a bracket 134 that is aligned with an opening 136 in the wall of the module that faces the power entry module. Referring briefly to FIGS. 4 and 5, the opening 136 is aligned with the cable pass-through 110 in the wall of the power entry module 20. The plugs 130 and 132 mate with the connectors 106 and 108 of FIG. 5.

Also shown in FIG. 6 is a plug 138 that connects to the battery module. One of the wires 140 from the plug 138 is attached to a load terminal of an on/off switch 142. The line terminal of the switch is attached to a wire 144 that leads to a connector 146. Battery power and recharging power are conducted to and from the circuit board 128 by means of the connector 146 and the plug 138.

As previously noted, the power management module 22 is fixed in position relative to the other modules by means of a bolt-and-nut arrangement and by means of a fingers-and-slot arrangement. The bolt passes through the opening in the bracket 62, and the nut 70 is threaded onto the bolt. Fingers 148 and 150 are shown in the lower wall of the module 22. These fingers slide into slots on the system housing to provide a fastenerless holddown at the end of the module opposite to the bracket 62.

FIG. 6 illustrates the metallic gaskets 34 and 36 that were previously described with reference to FIG. 1. The gasket 34 includes three tabs 152 and 154 at each lengthwise edge and a single tab 156 and 158 at each widthwise edge. Each tab has a protrusion at its outer side, and the wall of the base 126 includes an array of slots 160 that are aligned to receive the protrusions of the tabs. Four of the slots 160 are shown in FIG. 6.

The gasket 34 preserves EMC integrity while accommodating manufacturing tolerances. The attachment of the metallic gasket to the module 22 permits compression. Since the mounting is achieved by protrusions at the outer end of the tabs 152–158, the gasket may be bowed outwardly to some degree. The battery management module 22 is designed to abut the power entry module, with the compressible gasket 34 providing EMC containment at the module-to-module interface.

In like manner, the second metallic gasket 36 accommodates manufacturing tolerances for the interface with the battery module. Each of four tabs 162 includes a protrusion that is aligned with a slot 164 in the cover 124 of the module 22. The mounting arrangement may bow the gasket 36 outwardly, permitting some compression as the battery management module 22 is caused to abut the battery module 24. Again, EMC containment is preserved.

Figure 7:
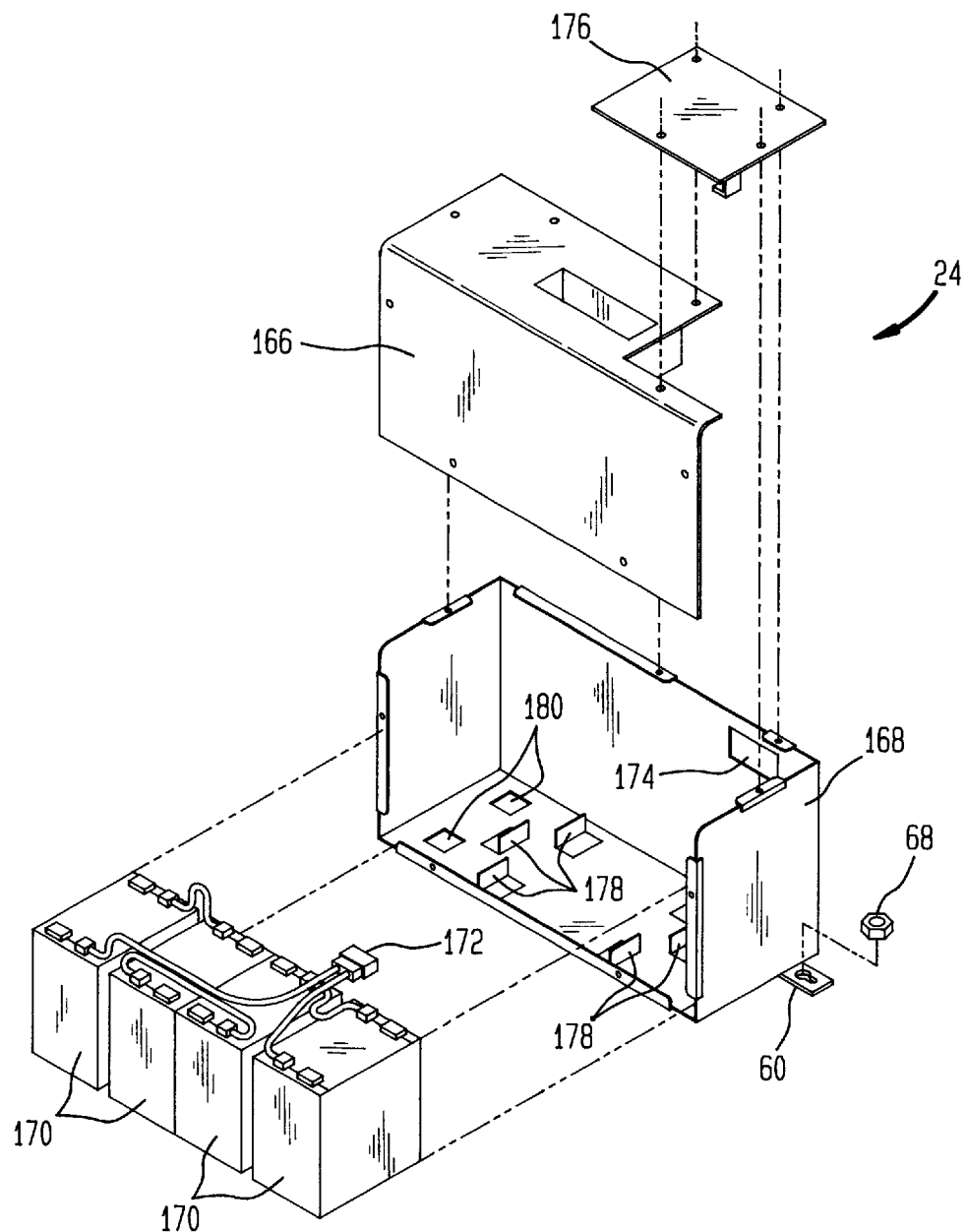
FIG. 7 is an exploded perspective view of the battery module of FIG. 2.

FIG. 7 is an exploded view of the battery module 24. A cover 166 is connected to a base 168 to form an EMC containment compartment for four batteries 170. In the embodiment of FIG. 7, the four batteries are interconnected to provide −48V at a cable connector 172 that is aligned with an opening 174 to allow the connector to be joined with the plug 138 of the battery management module 22 in FIG. 6. A second cover 176 is easily removed to provide access to the cable connector when the modules are to be connected or disconnected.

An array of raised tabs 178 securely positions the batteries 170 within the EMC containment compartment. As previously noted, the module 24 itself is fixed in position relative to the system housing by a pair of fingers 180 that slide into slots and by a nut 68 that is threaded onto a stud that projects through the opening of the bracket 60.

The EMC containment approach of FIGS. 1–7 provides a more economic power management system without jeopardizing electromagnetic compatibility. The modularity allows a user to delete a battery management system and a backup battery without leaving a large vacant area within an expensively constructed EMC containment structure.

We claim:

1. A power management system having electromagnetic compatibility containment comprising:

a first module having walls that define a first generally enclosed area, said first module having circuit means for supplying power required to operate a device of interest, said circuit means being contained within said first generally enclosed area;

a line current input cable in communication with said circuit means and extending from said first module for connection to a source of power;

a battery current input cable in communication with said circuit means and extending from said first module for connection to a supply of direct current;

an output current cable in communication with said circuit means and extending from said first module for connection to said device of interest;

a second module having walls that define a second generally enclosed area, said second module being adjacent to said first module and having battery management circuitry in communication with said circuit means via said battery current input cable, said battery management circuitry being contained within said second generally enclosed area; and a third module having walls that define a third generally enclosed area, said third module having a battery and being adjacent to said second module, said battery being contained within said third generally enclosed area and being in communication with said battery management circuitry of said second module.

2. The system of claim 1 further comprising a system housing, each of said first, second and third modules being releasably connected to said system housing.

3. The system of claim 2 wherein said walls of each of said first, second and third modules are metallic to establish electromagnetic compatibility (EMC) containment.

4. The system of claim 3 further comprising metallic gaskets connecting cable openings in said second module to a cable opening in said first module and to a cable opening in said third module.

5. The system of claim 1 wherein said first module includes an internal metallic barrier dividing said first generally enclosed area into first and second compartments, said first compartment having an AC line filter having an input connected to an end of said line current input cable, said second compartment having AC rectifying circuitry connected to an output of said AC line filter.

6. The system of claim 1 wherein said circuit means of said first module includes circuitry for establishing voltages for a telecommunications system.

7. The system of claim 2 wherein said first, second and third modules are individually mounted to said system housing to fix said modules in position in an absence of fasteners directly connecting said modules.

8. The system of claim 1 wherein said output current cable includes a braided shield, said braided shield being electrically grounded to said first module.

9. An electromagnetic compatibility (EMC) containment system for power management to operate a device of interest comprising:

a system housing;

a battery subassembly having a metallic frame that forms a first EMC compartment, said battery subassembly being fastened to said system housing, said battery subassembly having a battery located within said first EMC compartment and having a first opening in said metallic frame for passage of a battery cable connected to said battery;

a battery management subassembly having a metallic frame that forms a second EMC compartment, said battery management subassembly being fastened to said system housing independently of said battery subassembly, said battery management subassembly having battery recharging circuitry and having a second opening in said metallic frame in alignment with said first opening of said battery subassembly to receive said battery cable, said battery management subassembly having a third opening in said metallic frame for passage of a direct current input cable;

a first metal gasket extending from said first opening to said second opening to preserve integrity of EMC containment between said first and second EMC compartments;

a power entry subassembly having a metallic frame that forms a third EMC compartment, said power entry subassembly being fastened to said system housing independently of said battery and battery management subassemblies, said power entry subassembly having a fourth opening in said metallic frame in alignment with said third opening of said battery management subassembly to receive said direct current input cable, said power entry subassembly having an alternating current input cable extending therefrom for connection to a source of alternating current and having an output cable extending therefrom for connection to said device of interest, said power entry subassembly further having circuit means for supplying preselected voltages to said output cable; and a second metal gasket extending from said third opening of said battery management subassembly to said fourth opening of said power entry subassembly to preserve integrity of EMC containment between said second and third EMC compartments.

10. The system of claim 9 wherein each of said subassemblies is connected to said system housing using a slot-and-finger arrangement in which projections slide into slots to fix said subassemblies in position on said system housing.

11. The system of claim 10 wherein each of said subassemblies is further connected to said system housing using a nut-and-bolt arrangement.

12. The system of claim 9 wherein said first and second metal gaskets are each formed of spring steel.

13. The system of claim 9 further comprising said output cable, said output cable having a braided shield that is electrically grounded to said metallic frame of said power entry subassembly.

14. The system of claim 9 wherein said circuit means of said power entry subassembly includes rectifying circuitry for establishing voltages required to operate a telecommunications system.

15. A telecommunications power management system for providing power to a telecommunications system comprising:

a power entry module having power regulating circuitry generally enclosed within a first electromagnetic compatible (EMC) compartment;

a line cable connected to said power entry module for connection to an AC supply;

an output cable extending from said power entry module to said telecommunications system;

a DC input cable having a first end connected to said power entry module;

a battery management module having DC current control circuitry generally enclosed within a second EMC compartment, said battery management module being adjacent to said power entry module and being connected to a second end of said DC input cable;

a first module-to-module interface along at least a portion of said DC input cable to preserve EMC integrity between said first and second EMC compartments;

a battery module having a battery generally enclosed within a third EMC compartment, said battery module being adjacent to said battery management module;

a battery cable having a first end connected to said battery module and having a second end connected to said battery management module; and a second module-to-module interface along at least a portion of said battery cable to preserve EMC integrity between said second and third EMC compartments.

16. The system of claim 15 wherein each of said first and second module-to-module interfaces is a metal gasket arrangement.

17. The system of claim 16 further comprising a housing to which each of said modules is mounted.

18. The system of claim 17 wherein each of said modules includes a metallic frame to define said first, second and third EMC compartments.

19. The system of claim 15 wherein said power entry module includes removable covers at openings for passage of said output cable and said DC input cable.

* * * * *